United States Patent [19]
Lee et al.

[11] Patent Number: 5,591,672
[45] Date of Patent: Jan. 7, 1997

[54] ANNEALING OF TITANIUM - TITANIUM NITRIDE IN CONTACT HOLE

[75] Inventors: Ching-Ying Lee, Hsin Chu; Shaw-Tzeng Hsia, Taipei; Haw Yen, Hsin-chu, all of Taiwan

[73] Assignee: Vanguard International Semiconductor Corporation, Hsin-chu, Taiwan

[21] Appl. No.: 549,263

[22] Filed: Oct. 27, 1995

[51] Int. Cl.⁶ .................................................. H01L 21/30
[52] U.S. Cl. .......................... 437/190; 437/192; 437/247
[58] Field of Search ..................................... 437/190, 192, 437/247

[56] References Cited

U.S. PATENT DOCUMENTS

| | | | |
|---|---|---|---|
| 4,994,410 | 2/1991 | Sun et al. | 437/192 |
| 5,232,871 | 8/1993 | Ho | 437/192 |
| 5,275,715 | 1/1994 | Tuttle | 437/192 |
| 5,286,675 | 2/1994 | Chen et al. | 437/195 |
| 5,434,044 | 7/1995 | Nulman et al. | 437/192 |
| 5,525,543 | 6/1995 | Chen | 437/192 |

FOREIGN PATENT DOCUMENTS

| | | |
|---|---|---|
| 01220824 | 9/1989 | Japan . |
| 05029316 | 2/1993 | Japan . |
| 06275559 | 9/1994 | Japan . |

*Primary Examiner*—John Niebling
*Assistant Examiner*—Thomas G. Bilodeau
*Attorney, Agent, or Firm*—George O. Saile

[57] ABSTRACT

A process has been developed in which small diameter contact holes can be filled with chemically vapor deposited tungsten, without severe attack of the contact hole liner materials. An adhesive layer of titanium, and a barrier layer of titanium nitride are used for the contact hole liner, and are deposited prior to tungsten process. A process consisting of subjecting the barrier layer of titanium nitride to a rapid thermal anneal, in an ammonia ambient, results in enhanced barrier characteristics. The robust titanium nitride layer is now able to survive the tungsten deposition process, and attack form fluorine ions, produced during the decomposition of the tungsten source, tungsten hexafluoride.

26 Claims, 4 Drawing Sheets

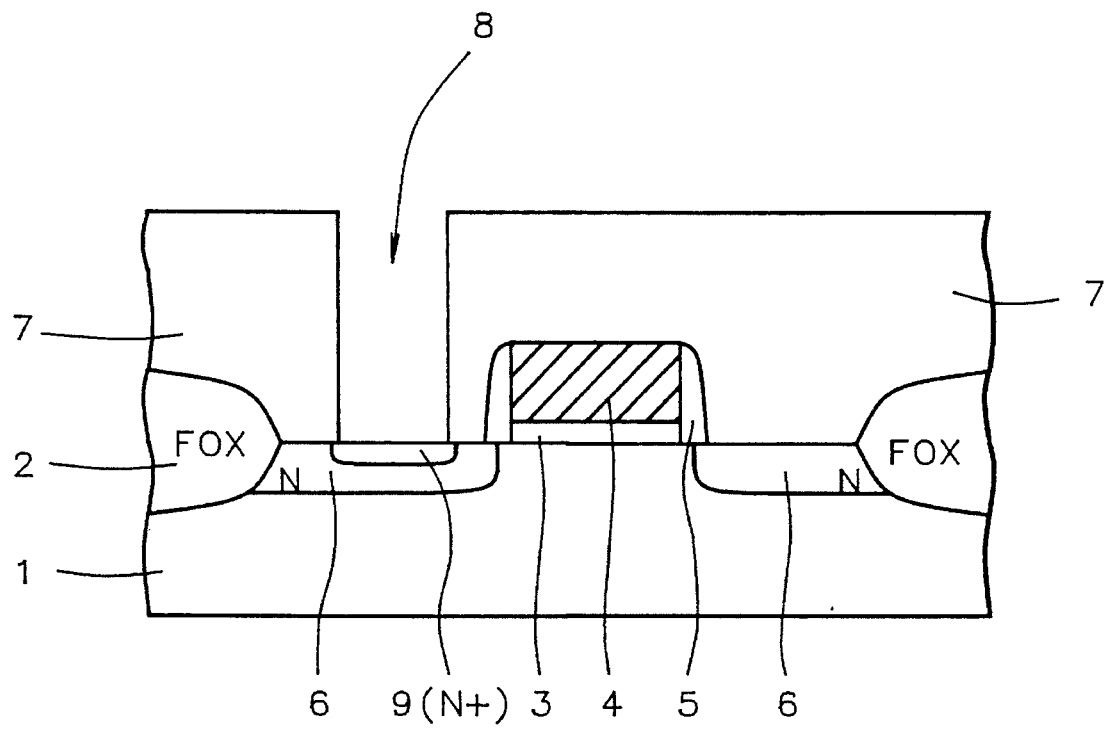
FIG. 1
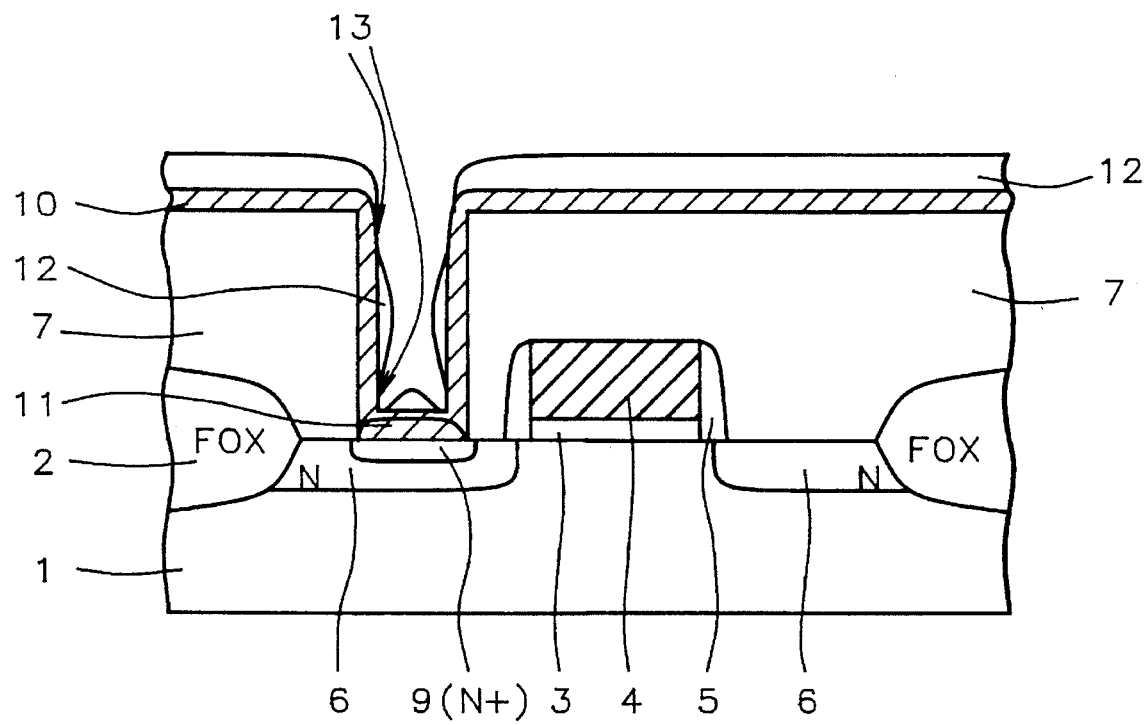
FIG. 2 – Prior Art

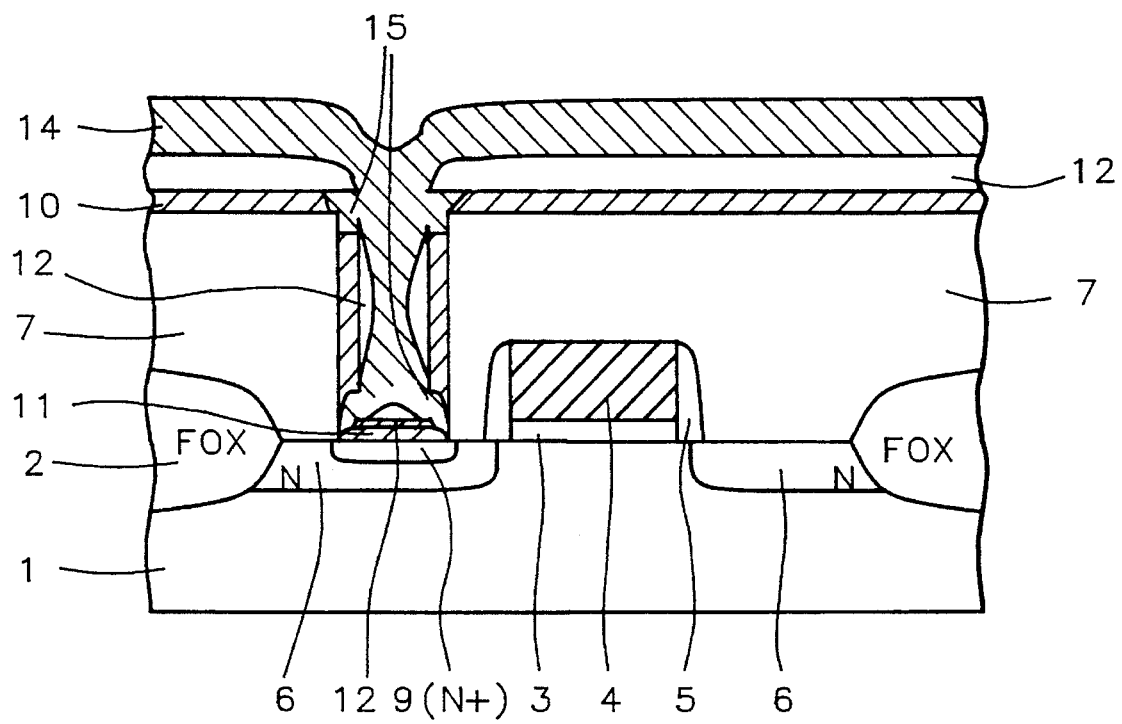
FIG. 3 – Prior Art
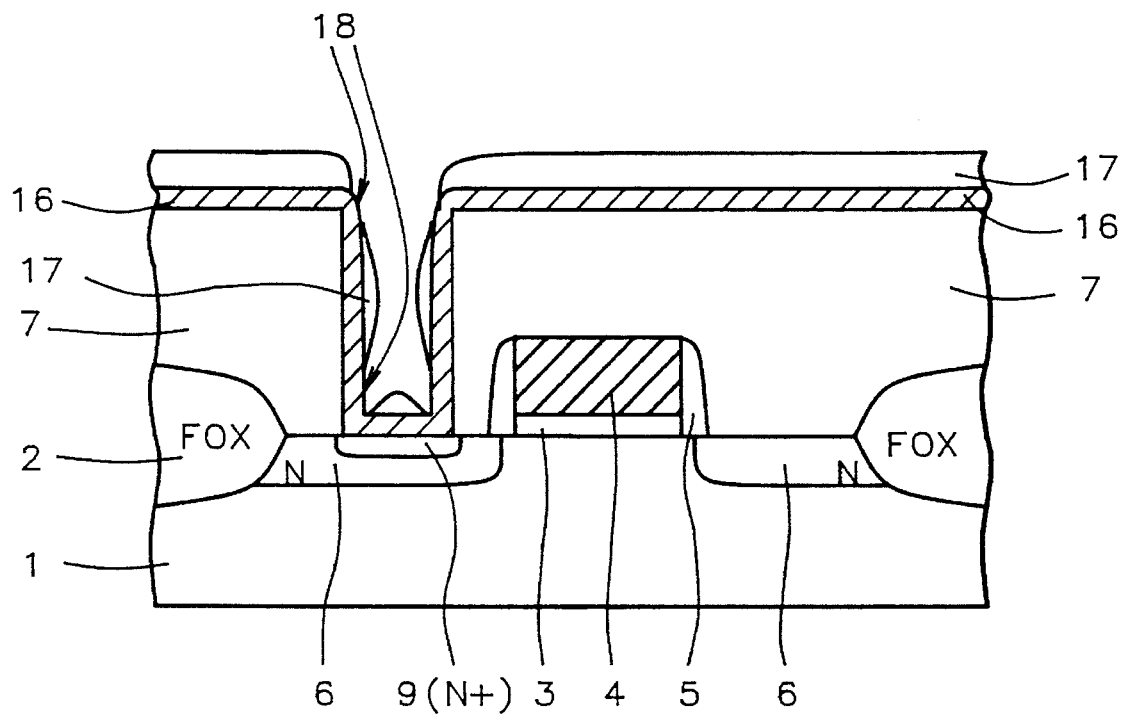
FIG. 4

ANNEALING OF TITANIUM - TITANIUM NITRIDE IN CONTACT HOLE

BACKGROUND OF THE INVENTION (1) Field of the Invention

The present invention relates to a fabrication method used for semiconductor devices, and more specifically to an optimized process for creating reliable, metal filled contact holes, used to connect an active device region to an overlying metallization.

(2) Description of Prior Art

The trend in the semiconductor industry to micro-miniaturazationg enabling the manufacture of higher performing silicon devices, while still maintaining or reducing the cost of semiconductor chips, has created increased reliability demands. Micro-miniaturazation has allowed specific device images, in the sub-micron range, to be routinely fabricated. However when metal filled contact holes, used to connect an overlying metallization to an underlying silicon device region, are fabricated using contact holes with diameters in the 0.50 µM range, severe restrictions on the choice of metal fill exist. The increased current density, now present with smaller diameter contact holes, discourage the use of aluminum based metallurgies for contact fills. The poor electromigration characteristics of this metallurgy presents reliability concerns for advanced designs, using smaller contact hole shapes.

The industry has attempted to solve the current carrying, or reliability situation, by migrating to tungsten or tungsten silicide to fill the small diameter contact holes. The improved electromigration resistance of tungsten type metallzations has resolved the reliability concerns arising with aluminum metallizations. Tungsten is easily deposited and patterned, with acceptable conductivity, and thus has found use in the semiconductor industry as a metal fill, or plug, for small diameter contact holes. However the use of tungsten initially requires a deposition of an adhesive layer, followed by a deposition of a barrier layer, prior to the deposition of the tungsten fill. The adhesive layer, titanium in most cases, is used to provide a stronger bond between the metal fill and the sides of the silicon oxide contact hole, then would have existed if tungsten was used directly in the contact. Titanium, at the bottom of the contact hole where it interfaces silicon, provides an excellent ohmic contact when subjected to elevated temperatures, forming a titanium disilicide layer. The barrier layer, usually titanium nitride, is used to protect the titanium layer from the reaction products generated during the tungsten fill deposition. The tungsten fill is accomplished via low pressure chemical vapor deposition, (LFCVD), using tungsten hexafluoride as source material. Free fluorine ions can attack the exposed titanium adhesive layer during the initial stages of tungsten deposition, if the barrier layer were not employed. This process has been described by Chen, et al, in U.S. Pat. No. 5,286,675. However that process does not account for the poor step coverage or poor conformality of the sputtered titanium nitride barrier layer, resulting in the exposure of underlying titanium to the deleterious attack of fluoride ions produced during the tungsten deposition. The fluoride attack of the exposed titanium layer, through defects in titanium nitride, can lead to ultimate loss of adhesion of the tungsten fill. Another phenomena, the volatile fluoride gas, penetrating along the titanium-titanium interface, at points of poor titanium nitride coverage, can ultimately result in an enhanced peeling, or volcano effect, causing a lifting of the composite layers from the sides of the hole.

This invention will describe a process in which a titanium-titanium nitride composite layer is used with LPCVD tungsten filled contact holes. However this process will incorporate unique annealing steps, needed to produce more effective titanium nitride layers, along with protecting exposed titanium in areas of poor titanium nitride coverage, such that tungsten fills can be accomplished without the occurrence of metal peeling or other yield degrading phenomena.

SUMMARY OF THE INVENTION

It is an object of this invention to provide an optimized process for the fabrication of tungsten filled contact holes, used to connect active silicon device regions, in a semiconductor substrate, to an overlying metallization.

It is another object of this invention to initially deposit a titanium layer in the contact hole, prior to filling with tungsten, to serve as a contact and adhesion layer.

It is still another object of this invention to deposit a barrier layer of titanium nitride, on a titanium layer, prior to filling the contact hole with tungsten.

It is still yet another object of this invention to treat the titanium nitride layer with ammonia, using rapid thermal annealing, for purposes of increasing the effectiveness of the titanium nitride barrier, prior to filling the contact hole with tungsten.

In accordance with the present invention a process is described for fabricating tungsten filled contact holes, with an enhanced barrier layer, used to connect active silicon device regions to overlying metallizations. A contact hole is opened in a dielectric layer, to an active device region in a semiconductor substrate. An ion implantation procedure is performed for purposes of increasing the dopant concentration at the bottom of the contact hole, to subsequently yield improved ohmic contact characteristics. A layer of titanium is deposited, followed by a deposition of a titanium nitride layer. A rapid thermal anneal, in an ammonia ambient, is next performed in order to incorporate additional nitrogen into the titanium nitride layer, and also to form titanium nitride on any underlying titanium that may have been exposed, due to defects in, or poor coverage of, the overlying titanium nitride layer. Chemical vapor deposition of tungsten is then performed to fill the contact hole, followed by dry etching procedures, used to remove unwanted tungsten from all areas except from the filled contact hole. Interconnect metallization and patterning complete the process.

BRIEF DESCRIPTION OF THE DRAWINGS

The object and other advantages of this invention are best described in the preferred embodiment with reference to the attached drawings that include:

FIG. 1, which schematically, in cross-sectional style, shows a silicon device, at a stage prior to contact hole filling.

FIGS. 2–3, which schematically in crosssectional style, show prior art, in which contact holes were filled with tungsten, without the use of enhanced barrier layers.

FIGS. 4–7, which schematically in crosssectional style, show the stages of fabrication used to create tungsten filled contact holes, using the enhanced barrier invention.

DESCRIPTION OF THE PREFERRED EMBODIMENTS

Figure 5:
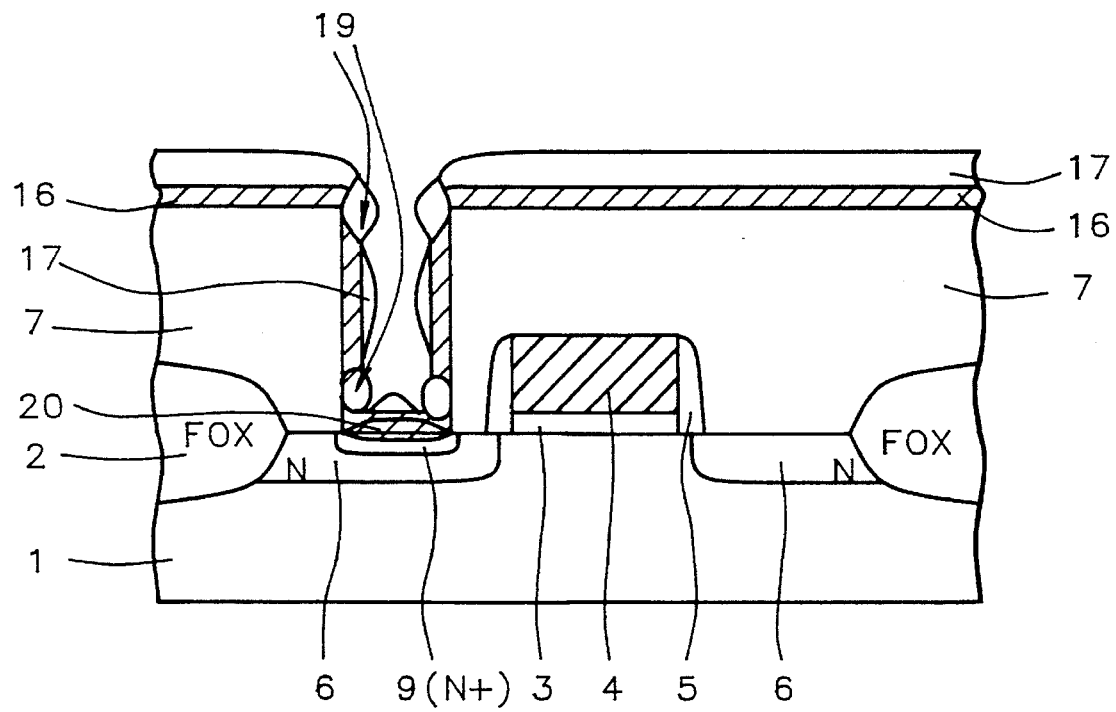

The method of creating contact holes, filled with tungsten, and using an enhanced titanium nitride barrier layer, will now be covered in detail. This invention can be used as part of metal oxide semiconductor field effect transistors, (MOSFET), devices that are currently being manufactured in industry, therefore only the specific areas unique to understanding this invention will be covered in detail.

A typical N type, (NFET), device, that the tungsten filled contact holes with an enhanced titanium nitride barrier layer, can be used with, is shown in FIG. 1. A substrate, 1, composed of P type, single crystalline silicon, with a <100> orientation, is used. Thick field oxide regions, 2, (FOX), are created, and used for isolation purposes. The FOX regions are produced by patterning a silicon nitride-silicon oxide, composite, using conventional photolithographic and selective, anisotropic, reactive ion etching, (RIE), techniques, and then using the composite pattern as an oxidation mask to allow between about 4000 to 6000 Angstroms of silicon dioxide to be thermally grown. After removal of the oxidation masking composite pattern, using hot phosphoric acid for the silicon nitride layer and buffered hydrofluoric acid for the thin underlying silicon oxide layer, a thin silicon dioxide gate insulator, 3, is grown at a temperature between about 800° to 1000° C., to a thickness between 50 to 300 Angstroms. A polysilicon layer is next deposited using low temperature chemical vapor depositions (LPCVD), processing, at a temperature between about 500° to 750° C., to a thickness between about 1500 to 4500 Angstroms. The polysilicon can be grown using insitu doping techniques, via the use of silane, and either phosphine or arsine. The polysilicon layer can also be deposited intrinsically and doped via ion implantation techniques, at an energy between about 50 to 100 Kev., at a dose between about 1E15 to 1E16 atoms/cm$^2$. Standard photolithographic and RIE procedures, using a chlorine etch chemistry, are then performed to create polysilicon gate structure, 4, shown in FIG. 1.

A silicon oxide layer is then deposited using either LPCVD or plasma enhanced chemical vapor deposition, (PECVD), processing using tetraethylorthosilicate as a source, at a temperature between about 500° to 800° C., to a thickness between about 1500 to 4500 Angstroms. A selective, anisotropic RIE procedure, using CHF3, is used to create the silicon oxide sidewall spacer, 5. Heavily doped source and drain regions, 6, are next formed via ion implantation of arsenic, at an energy between about 50 to 100 Kev., a dose between about 1E14 to 5E15 atoms/cm$^2$. After deposition of silicon oxide layer. 7, via either LPCVD or PECVD processing, at a temperature between about 400° to 800° C., to a thickness between about 6000 to 14000 Angstroms, a contact hole, 8, is opened to source and drain region, 6, via standard photolithographic and selective RIE techniques, using a CHF3 etch chemistry. The contact hole has a diameter between about 0.3 and 0.7 μm. Another ion implantation procedure, using arsenic at an energy between about 20 to 50 Kev., at a dose between about 1E15 to 5E15 atoms/cm$^2$, is used to create a more heavily doped region, 9, to be used to ultimately provide increased ohmic contact properties.

FIGS. 2–3, schematically describe prior art, and attempts at filling small diameter contact holes with LPCVD tungsten. First a layer of r.f. sputtered titanium, 10, is deposited for the dual purpose of providing adhesion between the contact hole oxide sidewall material and the subsequent metal fill, and also to provide the titanium needed to convert to a titanium disilicide layer, 11, at the bottom of the contact hole, as a result of subsequent elevated processing temperatures. This is shown in FIG. 2. The titanium nitride barrier layer, 12, is next deposited, again via use of r.f. sputtering. The ability to uniformly cover contact hole, 8, is influenced by the aspect ratio of the contact hole. As the diameter of the contact opening decreases, while the depth of the hole increases, the aspect ratio can increase to levels where coverage is difficult. Therefore more aggressive designs, creating high aspect ratios, can result in the lack of adequate sputtered titanium nitride conformality. FIG. 2, schematically shows specific areas, 13, where adequate titanium nitride coverage may be limited due to high contact hole aspect ratios. If the case shown in FIG. 2, does occur, subsequent deposition of the tungsten fill, 14, can create problems. The tungsten layer 14, shown in FIG. 3, is obtained via LPCVD decomposition of tungsten hexafluoride. This reaction results in the evolution of free fluorine ions, which in turn can attack and etch any exposed titanium. Again titanium can be exposed, in specific areas, 13, due to poor titanium nitride coverage. The removal of titanium, as a result of fluorine attack, creates defect regions, 15, shown schematically in FIG. 3. These regions, 15, now interfaced with tungsten, 14, can result in a loss of tungsten adhesion or peeling of the tungsten from the sides of contact holes, 8. This peeling effect, originally initiated as a result of poor titanium nitride, 12, step coverage, is usually more pronounced at the edges of silicon wafer, creating a serious yield problem.

A process will now be described in which the reduction or elimination of the peeling phenomena is accomplished via the fabrication of enhanced titanium nitride barrier layers. A titanium layer, 16, is deposited via r.f. sputtering, to a thickness between about 250 to 500 Angstroms. Prior to the titanium deposition, a pre-clean, designed to remove native oxide from N+ region, 9, performed in a solution of 200 parts water to 1 part hydrofluoric acid, for about 90 seconds. Next another r.f. sputtering process is employed to deposit between about 800 to 1800 Angstroms of titanium nitride, 17, sputtered using either a titanium nitride target, or reactively sputtered from a titanium target in a nitrogen ambient. This is schematically shown in FIG. 4, and again as was the case with the prior art, the lack of conformality or step coverage of the titanium nitride process, resulting when attempting to sputter deposit in large aspect ratio contact holes, results in bare region, 18, leaving titanium exposed.

In order to protect the bare regions, 18, where titanium, 16, is not protected by the titanium nitride barrier layers 17, a novel rapid thermal anneal process using an ammonia, or nitrogen ambient, is employed. The anneal will improve the integrity of titanium nitride 17, by stuffing the layer with additional nitrogen. However this process will also allow the formation of new titanium nitride pockets, 19, in areas of exposed titanium. This is shown schematically in FIG. 5. The conditions used for this critical anneal are first to avoid any native oxide formation by loading the wafers into the sputtering tool at a temperature between about 350° to 450° C., in a nitrogen flow of about 20 liters/min. The ramp up and stabilization step is next performed, first at a temperature between about 575° to 625° C., for a period of about 60 sec., using between 3 to 5 liters/min. of ammonia, followed by another ammonia exposure, using between about 2 to 5 liters/min., at a temperature between about 700° to 740° C., for about 20 sec. Finally the ramp down and unload procedures are accomplished in a nitrogen flow of about 20 liters/min., at a temperature between about 350° to 450° C. The amount of titanium nitride pockets, 19, formed during this rapid thermal anneal process is between about 100 to 500 Angstroms. This anneal process also results in the formation of titanium disilicide, 20, at the bottom of contact hole, 9. It should be mentioned that the formation of titanium nitride pockets, 19, can also be accomplished using rapid thermal annealing using nitrogen gas. However the less reactive nitrogen demands either higher anneal temperatures, or longer anneal cycles to produce titanium nitride pockets, equivalent to those formed via use of ammonia annealing.

Figure 6:
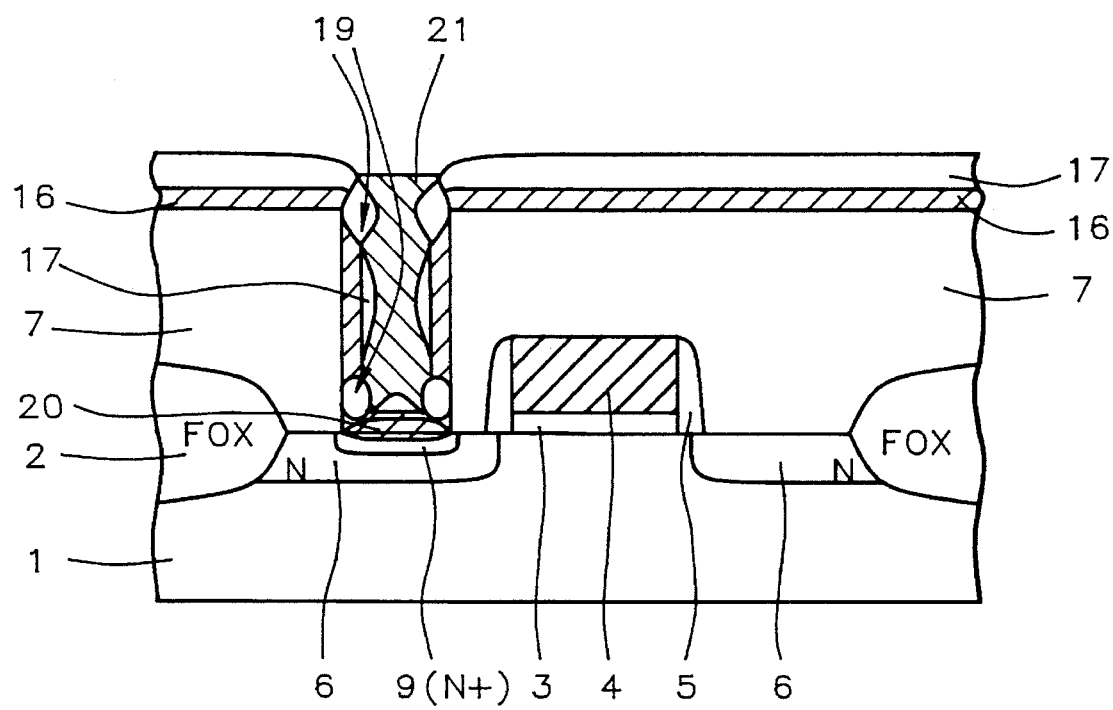
Figure 7:
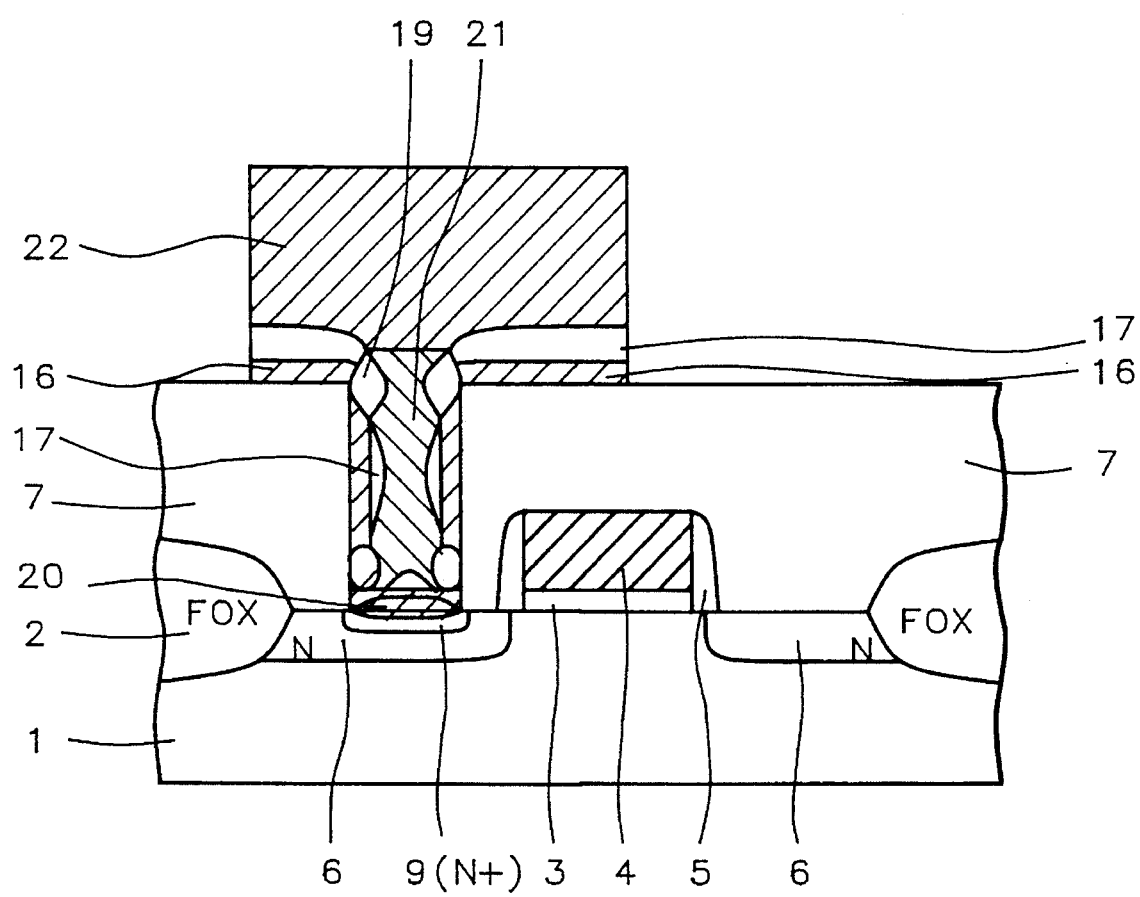

The deposition of tungsten, 21, via LPCVD processing, at a temperature between about 400° to 500° C., to a thickness between about 5000 to 9000 Angstroms, using tungsten hexafluoride is shown in FIG. 6. It can be seen that the tungsten now entirely interfaces underlying titanium nitride layer, 17, or titanium nitride pockets, 19. Thus free fluorine ions, generated during the tungsten hexafluoride decomposition process, are unable to attack or etch titanium layer, 16, thus avoiding the deleterious tungsten adhesion loss, or peeling phenomena. Also included in FIG. 6, is the removal of the unwanted tungsten, using selective RIE processes, via a $SF_6$ and argon etch chemistry, resulting in the tungsten plug, 21, in contact hole 8. FIG. 7, shows the fabrication of the interconnect metallization structure, 22. This is accomplished via r.f. sputter deposition of aluminum based metallurgy, using between about 0.5 to 3% copper, and between about 0.5 to 1% silicon, to a thickness between about 4000 to 6000 Angstroms. Finally conventional photolithographic and RIE processing, using a chlorine etch chemistry, are used to produce the interconnect structure.

This process for enhanced titanium barriers, for tungsten filled contact holes, although shown as part of an NFET device, can also be applied to P type, (PFET), complimentary, (CMOS), and BiCMOS devices.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device on a semiconductor substrate, using a contact hole, lined with an adhesive and barrier layers and filled with a metal, to provide electrical contact between an active device region in said semiconductor substrate, and an overlying metal interconnect structure, comprising the steps of:

providing device elements on said semiconductor substrate;

deposition of a dielectric layer on said semiconductor substrate, including deposition on said device elements;

photolithographic processing to open a region in photoresist, exposing said dielectric layer, directly over a specific region of said device element;

anisotropic etching of said dielectric layer, in opened region of said photoresist, to create a contact hole to said specific region of said device element;

ion implanting a first conductivity imparting dopant into said specific region of said device element, to create said active device region;

surface cleaning of said active device region;

deposition of an adhesive layer on said dielectric layer, on sides of said contact hole, and on surface of said active device region;

deposition of a barrier comprising a metal nitride layer on said adhesive layer;

after the deposition of the barrier layer, rapid thermal annealing in a nitrogen containing ambient thereby nitriding a portion of the adhesive layer;

deposition of said metal, on said barrier layer, completely filling said contact hole;

etchback of said metal to form a metal plug in said contact hole;

deposition of an interconnect metallization layer; and patterning of said interconnect metallization layer to form said metal interconnect structure.

2. The method of claim 1, wherein said device element in said semiconductor substrate , is an N type, field effect transistor.

3. The method of claim 1, wherein said dielectric layer is silicon oxide, deposited using LPCVD or PECVD processing, at a temperature between about 400° and 800° C., to a thickness between about 6000 and 14000 Angstroms.

4. The method of claim 1, wherein said contact hole is formed via anisotropic RIE processing, using $CHF_3+CF_4+$ argon, with said contact hole having a diameter between about 0.3 and 0.7 μm.

5. The method of claim 1, wherein said first conductivity imparting dopant is arsenic, ion implanted at an energy between about 20 and 50 Key., at a dose between about 1E15 and 5E15 atoms/cm$^2$.

6. The method of claim 1, wherein surface cleaning of said active device region is performed using a solution of water and hydrofluoric acid, at a temperature between about 20° and 25° C., for a time between about 75 and 105 seconds.

7. the method of claim 1, wherein said adhesive layer is titanium, deposited via r.f. sputtering, to a thickness between about 250 and 500 Angstroms.

8. The method of claim 1, wherein said barrier layer is titanium nitride, deposited using r.f. sputtering, using a titanium nitride target, to a thickness between about 800 and 1800 Angstroms.

9. The method of claim 1, wherein said barrier layer is titanium nitride, deposited using reactive r.f. sputtering, using a titanium target in a nitrogen containing ambient, to a thickness between about 800 and 1800 Angstroms.

10. The method of claim 1, wherein said rapid thermal annealing of said barrier layer is performed by; loading of wafers in rapid thermal anneal furnace at a temperature between about 350° and 450° C., in a nitrogen flow of about 20 liters/min., ramp up and stabilization an a temperature between about 575° and 625° C., for about 60 seconds in an ammonia flow of between about 2 and 5 liters/min., ramp up and stabilization at a temperature between about 700° and 740° C., for about 20 seconds in a ammonia flow between about 2 and 5 liters/min., and ramp down and unload at a temperature between about 350° and 430° C., in a nitrogen flow of about 20 liters/min.

11. The method of claim 1, wherein said rapid thermal annealing of said barrier layer is performed in an ammonia ambient, at a temperature between about 700° and 740° C., for a time between about 10 and 60 seconds.

12. The method of claim 1, wherein rapid thermal annealing of said barrier layer is performed in a nitrogen flow between about 2 and 5 liters/min., at a stabilization temperature between about 650° and 800° C., for a time between about 30 and 90 seconds.

13. The method of claim 1 in wherein said rapid thermal annealing of said barrier layer results in the formation of a titanium disilicide layer at the bottom of said contact hole, to a thickness between about 100 and 300 Angstroms.

14. The method of claim 1, wherein said metal is tungsten, deposited using LPCVD processing, at a temperature between about 400° and 500° C., to a thickness between about 5000 and 9000 Angstroms, using tungsten hexafluoride as a source material.

15. A method for fabricating a MOSFET device, on a semiconductor substrate, using a contact hole lined with titanium, for adhesion purposes, titanium nitride, for barrier purposes, and filled with tungsten, to provide electrical contact between an active device region and an overlying metal interconnect structure, comprising the steps of:

providing device elements on said semiconductor substrate;

deposition of a dielectric layer on said semiconductor substrate, including deposition on said device elements;

photolithographic processing to open a region in photoresist, exposing said dielectric layer, directly over a specific region of said device element;

anisotropic etching of said dielectric layer, in opened region of said photoresist, to create a contact hole to said specific region of said device element;

ion implanting a first conductivity imparting dopant, into said specific region of said device element, to create a doped N type region;

surface cleaning of said doped N type region;

deposition of said titanium layer, on said dielectric layer, on sides of said contact hole, and on said doped N type region;

deposition of said titanium nitride layer on said titanium layer;

after the deposition of said titanium nitride layer, rapid thermal annealing in an ammonia ambient thereby nitriding a portion of said titanium layer;

deposition of said tungsten on said titanium nitride layer, completely filling said contact hole;

etchback of said tungsten to form a tungsten plug in said contact hole;

deposition of an interconnect metallization layer; and patterning of said interconnect metallization layer to form said metal interconnect structure.

16. The method of claim 15, wherein said device element in said semiconductor substrate, is an N type field effect transistor.

17. The method of claim 15, wherein said dielectric layer is silicon oxide, deposited using LPCVD or PECVD processing, at a temperature between about 400° and 800° C., to a thickness between about 6000 and 14000 Angstroms.

18. The method of claim 15, wherein said first conductivity imparting dopant is arsenic, ion implanted at an energy between about 20 and 50 Kev., at a dose between about 1E15 and 5E15 atoms/cm$^2$.

19. The method of claim 15, wherein said titanium layer is deposited using r.f. sputtering, to a thickness between about 250 and 500 Angstroms.

20. The method of claim 15, wherein said titanium nitride layer is deposited via r.f. sputtering, using a titanium nitride target, to a thickness between about 800 and 1800 Angstroms.

21. The method of claim 15, wherein said titanium nitride layer is deposited via reactive r.f sputtering, using a titanium target, to a thickness between about 800 and 1800 Angstroms.

22. The method of claim 15, wherein said rapid thermal annealing of said titanium nitride layer is performed by; initially loading wafers into rapid thermal anneal furnace at a temperature between about 350° and 450° C., in a nitrogen flow of about 20 liters/min., ramp up and stabilization at a temperature between about 575° and 625° C., for a time of about 60 seconds, in an ammonia flow between about 2 and 5 liters/min., ramp up and stabilization at a temperature between about 700° and 740° C., for a time of about 20 seconds, in an ammonia flow between about 2 and 5 liters/min., and ramp down and unload at a temperature between about 350° and 450° C., in a nitrogen flow of about 20 liters/min.

23. The method of claim 15, wherein said rapid thermal annealing of said titanium nitride layer is performed in an ammonia ambient, at a temperature between about 700° to 740° C., for a time between about 10 and 60 seconds.

24. The method of claim 15, wherein said rapid thermal annealing of said titanium nitride layer is performed in a nitrogen flow of between about 2 and 5 liters/min., at a stabilization temperature between about 650° and 800° C., for a time between about 30 and 90 seconds.

25. The method of claim 15, wherein said rapid thermal annealing, of said titanium nitride layer, results in the creation of a titanium disilicide layer, at the bottom of said contact hole, from the reaction of said titanium layer and said doped N type region, to a thickness between about 100 and 300 Angstroms.

26. The method of claim 15, wherein said tungsten is deposited using LPCVD processing, at a temperature between about 400° and 500° C., to a thickness between about 5000 and 9000 Angstroms, using a tungsten hexafluoride source.

* * * * *